(12) United States Patent
Goller et al.

(10) Patent No.: US 7,517,722 B2
(45) Date of Patent: Apr. 14, 2009

(54) METHOD OF PRODUCING A UNIVERSAL SEMICONDUCTOR HOUSING WITH PRECROSSLINKED PLASTIC EMBEDDING COMPOUNDS

(75) Inventors: Bernd Goller, Otterfing (DE); Robert-Christian Hagen, Sarching (DE); Gerald Ofner, Bad Abbach (DE); Christian Stuempfl, Schwandorf (DE); Stefan Wein, Regensburg (DE); Holger Wörner, Regensburg (DE)

(73) Assignee: Infineon Technologies AG, Munich (DE)

( * ) Notice: Subject to any disclaimer, the term of this patent is extended or adjusted under 35 U.S.C. 154(b) by 212 days.

(21) Appl. No.: 11/491,746

(22) Filed: Jul. 24, 2006

(65) Prior Publication Data

US 2006/0258046 A1  Nov. 16, 2006

Related U.S. Application Data

(62) Division of application No. 10/651,856, filed on Aug. 29, 2003, now abandoned.

(30) Foreign Application Priority Data

Aug. 29, 2002  (DE)  ................................. 102 40 460

(51) Int. Cl.
*H01L 21/44* (2006.01)
*H01L 21/48* (2006.01)
*H01L 21/50* (2006.01)

(52) U.S. Cl. ........................ 438/108; 438/106; 438/112; 438/124

(58) Field of Classification Search ................. 438/106, 438/108, 112, 124, 126, 127
See application file for complete search history.

(56) References Cited

U.S. PATENT DOCUMENTS 5,032,543 A  7/1991  Black et al.

(Continued)

FOREIGN PATENT DOCUMENTS

DE  44 27 309 A1  2/1996

(Continued)

OTHER PUBLICATIONS

Okuno, A., et al.: "High Reliability, High Density, Low Cost Packaging Systems for Matrix Systems for Matrix BGA and CSP by Vacuum Printing Encapsulation Systems (VPES)", IEEE Transactions on Advanced Packaging, vol. 22, No. 3, Aug. 1999, pp. 391-397.

*Primary Examiner*—Chuong Anh Luu
(74) *Attorney, Agent, or Firm*—Laurence A. Greenberg; Werner H. Stemer; Ralph E. Locher

(57) ABSTRACT

An electronic component and a blank have plastic embedding compounds of a first and a second plastic layer. Semiconductor chips are embedded in the first plastic layer in such a way that their marginal sides are surrounded by a bead. The second plastic layer compensates for the unevenness of a upper boundary of the first plastic layer.

23 Claims, 5 Drawing Sheets

U.S. PATENT DOCUMENTS

| | | |
|---|---|---|
| 5,049,980 A | 9/1991 | Saito et al. |
| 5,144,747 A | 9/1992 | Eichelberger |
| 5,306,670 A | 4/1994 | Mowatt et al. |
| 5,879,964 A | 3/1999 | Paik et al. |
| 5,923,958 A | 7/1999 | Chou |
| 5,972,735 A | 10/1999 | Dominic |
| 5,990,546 A | 11/1999 | Igarashi et al. |
| 6,239,482 B1 | 5/2001 | Fillion et al. |
| 6,515,355 B1 * | 2/2003 | Jiang et al. .................. 257/678 |
| 6,548,598 B2 | 4/2003 | Takeuchi et al. |
| 7,223,639 B2 * | 5/2007 | Blaszczak et al. ........... 438/127 |
| 2003/0040142 A1 | 2/2003 | Lin et al. |

FOREIGN PATENT DOCUMENTS

| | | |
|---|---|---|
| EP | 0 611 129 B1 | 8/1994 |
| JP | 2001093940 A | 4/2001 |
| WO | 88/03704 | 5/1988 |
| WO | 92/17901 | 10/1992 |
| WO | 96/04611 | 2/1996 |
| WO | 97/22993 | 6/1997 |

* cited by examiner

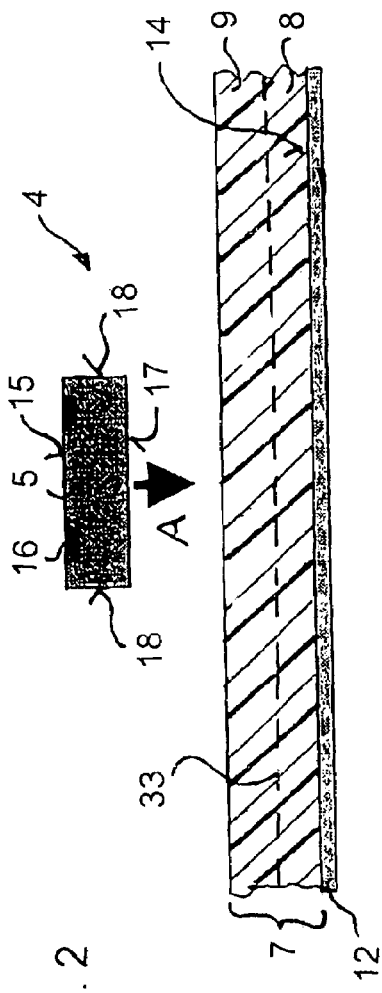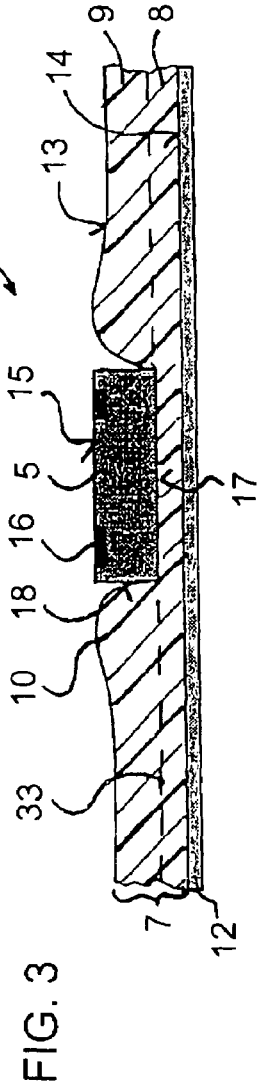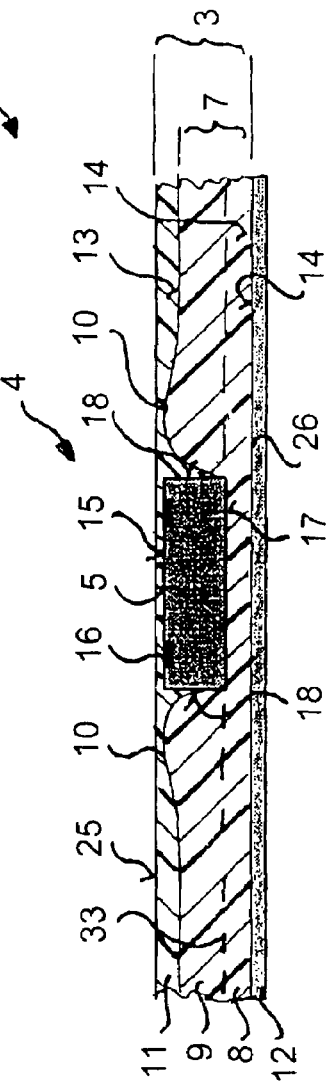

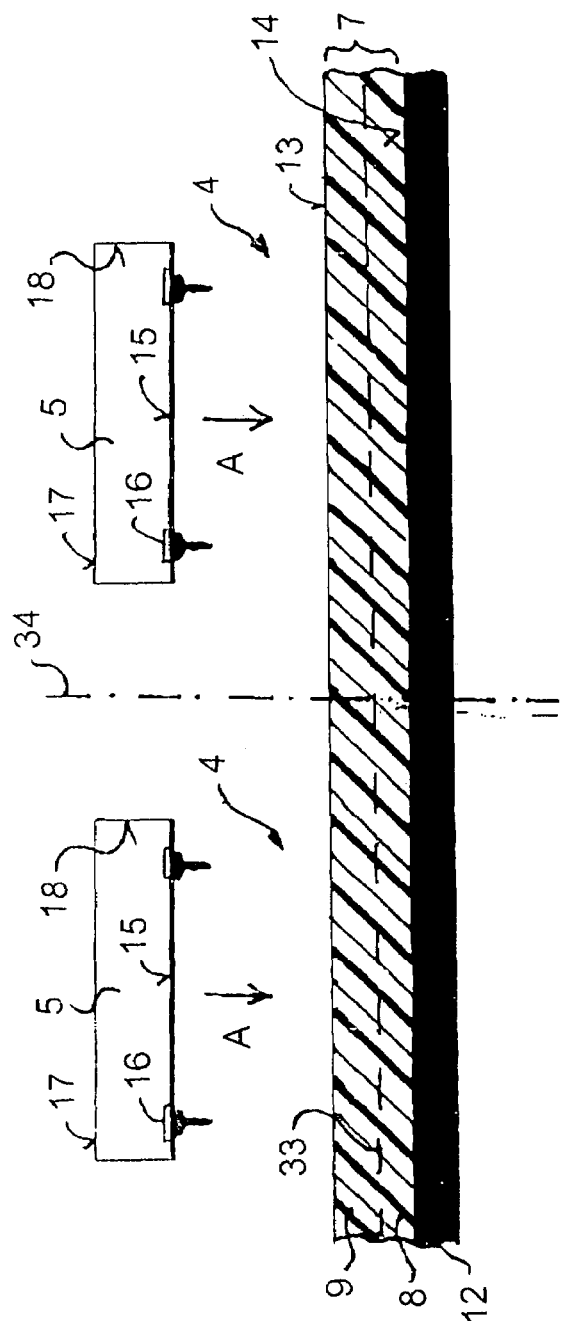
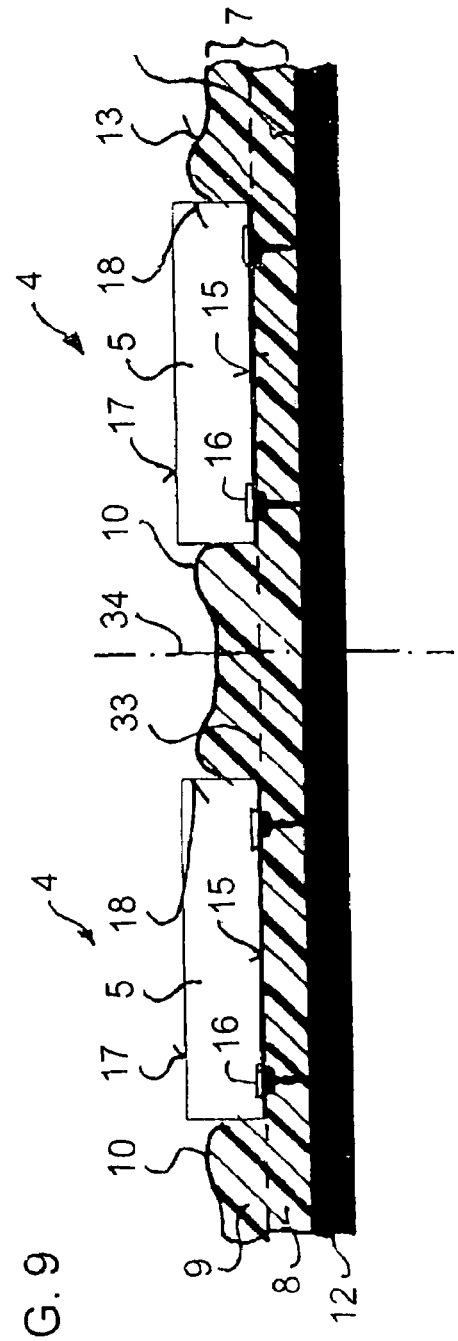

METHOD OF PRODUCING A UNIVERSAL SEMICONDUCTOR HOUSING WITH PRECROSSLINKED PLASTIC EMBEDDING COMPOUNDS

This is a division of application Ser. No. 10/651,856, filed Aug. 29, 2003 it is abandoned; the application also claims the priority, under 35 U.S.C. §119, of German patent application DE 102 40 460.7, filed Aug. 29, 2002; the prior applications are herewith incorporated by reference in their entirety.

BACKGROUND OF THE INVENTION

Field of the Invention

The invention lies in the semiconductor processing field and relates, more specifically, to a technology for the production of universal semiconductor housings by using precrosslinked plastic embedding compounds. In particular, the invention relates to a method of producing a blank having a plurality of component positions for electronic components which have such plastic embedding compounds, and also to electronic components having corresponding plastic embedding compounds.

U.S. Pat. No. 5,990,546 discloses an electronic component with a semiconductor chip in which the semiconductor chip is enclosed in a plastic embedding compound, and contact regions of the semiconductor chip are connected electrically via a separately provided wiring plate to external contacts of the electronic component. Providing a separate, complexly constructed wiring plate for an assembly of an electronic component is costly. In addition, during the production of electronic components of this type, the problem arises that connecting the contact regions of the semiconductor chips to corresponding contact connecting surfaces of the separately provided wiring plate is extremely difficult, and that high reject rates occur in such a method. Furthermore, the reliability of such electronic components is limited.

SUMMARY OF THE INVENTION

It is accordingly an object of the invention to provide a method of producing a universal semiconductor housing with precrosslinked plastic embedding compounds, which overcomes the above-mentioned disadvantages of the heretofore-known devices and methods of this general type and with which reliable connections between a semiconductor chip and external contacts of an electronic component are attained, the yield during the production of electronic components is improved, and the costs of producing electronic components are reduced.

With the foregoing and other objects in view there is provided, in accordance with the invention, a method of producing a blank having a plurality of component positions for electronic components, the method which comprises the following method steps:

producing at least one of a carrier plate and a first plastic layer from a plastic compound being more highly crosslinked in a lower region than in an upper region;

fitting a semiconductor chip in each of the component positions of the blank, and thereby forming a bead of plastic compound of the first plastic layer, the bead surrounding marginal sides of the semiconductor chip;

applying a second plastic layer; and curing the plastic layers for forming a self-supporting, dimensionally stable plastic plate with embedded semiconductor chips in the component positions.

In other words, we specify a method of producing a blank having a plurality of component positions for electronic components. In this case, the blank forms a self-supporting, dimensionally stable plastic plate made of plastic embedding materials. In each of the component positions, a semiconductor chip is embedded in the plastic plate. Wiring structures can then be directly applied layer by layer to this self-supporting, dimensionally stable plastic plate, so that with this method the production of a separate complex wiring plate is dispensed with and the problems of connecting contact surfaces of a wiring plate to the contact regions of a semiconductor chip are overcome, since, in the method according to the invention, no wiring plate has to be fitted with semiconductor chips.

The method of producing a blank of this type on which wiring layers for a plurality of electronic components can finally be deposited directly and simultaneously has substantially 4 method steps. Firstly, a carrier plate and/or a first plastic layer of a plastic embedding compound are provided, the first plastic layer being more highly crosslinked in a lower region than in an upper region. The level of crosslinking in the lower region can be so high that the lower region already forms a self-supporting, dimensionally stable plastic layer, so that the lower region of the first plastic layer already replaces the carrier plate.

On a carrier plate of this type and/or a first plastic layer of this type, a semiconductor chip is then fitted in the respective component position, forming a bead of plastic embedding compound which surrounds the marginal sides of the semiconductor chip. A second plastic layer is then applied, which completely embeds at least the marginal sides of the semiconductor chip. Then, by curing the plastic layers, a self-supporting, dimensionally stable plastic plate with embedded semiconductor chips is formed. The curing of the plastic layers can be accelerated by means of thermal treatment and/or by means of irradiation with high-energy light beams, such as with ultraviolet light.

The plastic embedding compound of the self-supporting, dimensionally stable plastic plate can have further plastic layers in addition to the two plastic layers. For example, fiber-reinforced plastic layers or those filled with glass spheres can be provided, in order to implement a self-supporting, dimensionally stable plastic plate with embedded semiconductor chips.

This method has the advantage that an expanded wafer in the form of a blank is formed, on which, for a plurality of components, wiring structures comprising wiring layers with contact connecting surfaces, wiring lines and external contact surfaces can be applied simultaneously in a parallel method. For this purpose, in each component position, a wiring structure is applied to the self-supporting, dimensionally stable plastic plate and is connected electrically to the contact regions of the semiconductor chip.

In this connection, contact regions of the semiconductor chip are understood to be the contact surfaces arranged directly on the semiconductor chip and, furthermore, also flip-chip contacts which are arranged on these contact surfaces. As flip-chip contacts, the semiconductor chip can have solder balls, which represent solder spheres soldered to the contact surfaces of the semiconductor chip. Furthermore, flip-chip contacts can be formed as solder bumps which are produced on the contact surfaces of a semiconductor chip by a printing technique with a subsequent sintering process. The flip-chip contacts on a semiconductor chip can also be formed as surface contacts, the contact surfaces of the semiconductor chip being enlarged and thickened, for example by means of a solderable material. Also possible as flip-chip contacts are head contacts, which have a thermocompression head and are known as "stud bumps." Furthermore, flip-chip contacts can be represented as elevated connecting surfaces by means of the electrochemical or chemical deposition of a metal on the contact surfaces as pillar contacts.

Even if the contact regions of the semiconductor chip have different forms and structures, they can nevertheless be connected reliably to wiring structures on account of the method according to the invention. If the contact regions of the semiconductor chip are covered, partly or completely, by a carrier plate or by one of the plastic layers, then the contact regions can be exposed by means of a photolithographic step before an application of wiring structures.

In order to produce a carrier plate, a base plate is heated up to temperatures between 120 and 350° C. This heated base plate can be coated with a first plastic layer of a plastic embedding compound. As the plastic embedding compound on the carrier plate cools down, a level of crosslinking which decreases toward a upper boundary of the first plastic layer in a vertically staggered manner is formed. A lower, hotter region of the first plastic layer, which makes direct contact with the heated base plate, will be more highly crosslinked as it cools than the region toward the upper side of the first plastic layer. For this purpose, the heatable base plate can have a metal alloy. This method variant has the advantage that, after the plastic embedding compounds of the blank have been cured, a metallic base plate can be pulled off from the dimensionally stable and self-supporting plastic plate which is produced.

In order to produce a solid plastic carrier plate, a first plastic layer of an uncrosslinked plastic embedding compound can be subjected to a temperature gradient such that, in the region of the underside of the first plastic layer, a completely crosslinked, self-supporting, dimensionally stable lower region is formed, while a level of crosslinking which decreases with the height of the plastic layer occurs above this. This variant of the carrier plate has the advantage that semiconductor chips can be pressed with their passive rear side into the upper, only precrosslinked region and can be fixed in this position, the penetration depth being predefined by the completely crosslinked region. In addition, it is then ensured that the active upper side of the semiconductor chip with the contact regions is not wetted by the plastic embedding material of the first plastic layer. Instead, part of the marginal side height of the semiconductor chip is wetted by the plastic embedding compound of the first plastic layer, forming a bead around the semiconductor chip.

For the production of the first plastic layer, an uncrosslinked plastic embedding compound can be filled with spherical particles of uniform sphere diameter. Particularly suitable for this purpose are glass spheres, which can be produced with extremely small diameters of the order of magnitude of a few 100 nanometers by a spraying process. This method variant has the advantage that a semiconductor chip can be pressed into the first plastic layer filled with spherical particles, the penetration depth being defined by the uniform sphere diameter.

While, in the exemplary embodiments of the method described hitherto, the semiconductor chip is introduced with its passive rear side into the upper, only precrosslinked region of the first plastic layer, the semiconductor chip can in each case be pressed with its active upper side and its contact regions into the first plastic layer in a component position of the blank, forming a bead which surrounds the marginal sides of the semiconductor chip. In this method variant, the level of crosslinking of the lower region of the first plastic layer has not progressed to such an extent that a completely crosslinked lower region has been formed, but rather the level of pre-crosslinking is still such that the contact regions can touch a carrier plate or a carrier foil made of metal. Since the passive rear side of the semiconductor chips now projects out of the first plastic layer at the component positions of the blank, these rear sides can subsequently be covered and protected by the second plastic layer.

In order to expose the contact regions, only the metal carrier plate or metal carrier foil is subsequently pulled off after the plastic layers have cured. A separate method step for exposing the contact regions of the semiconductor chips can be dispensed with in this method variant.

If the semiconductor chip is in each case initially pressed with its passive rear side into the first plastic layer at the component positions of the blank, forming a bead of plastic embedding compound which surrounds the marginal sides of the semiconductor chip, then the active upper side of the semiconductor chip with the contact regions projects out of the first plastic layer.

The semiconductor chips can be arranged in this first plastic layer to form a new, expanded wafer. The plastic embedding compound of the first plastic layer is also designated a "bi-stage" material, since the plastic embedding compound of the first plastic layer has at least two regions with a different level of crosslinking. Plastic embedding compounds of this type are partly crosslinked thermosetting plastics whose crosslinking process is frozen or interrupted. When this stage is frozen, the materials are firm and dimensionally stable but, if heat is introduced by heating to temperatures between 90 and 120° C., become partly viscous again, so that semiconductor chips can be placed.

On the other hand, as a result of a renewed supply of heat at temperatures between 120 and 350° C., the curing mechanism is once more started, so that the material can then crosslink completely. The use of material systems of this type for the first plastic layer consists in its being possible for the thermosetting plastic already to be applied to a carrier without being cured completely there. If this material is brought into contact with other not yet crosslinked thermosetting plastics, then chemical-physical crosslinking over the interface between the first and second plastic layers is also possible. Thus, excellent adhesion between the two materials of the first and second plastic layer can be achieved.

The second plastic layer can be applied to the first plastic layer in such a way that either the entire active upper side of a semiconductor chip is kept free of the second plastic layer or that at least the contact regions of the semiconductor chip remain free of the second plastic layer. Associated with the second plastic layer is the advantage that the upper side of the blank is leveled, so that a level surface is available for deposition of wiring structures on the blank.

The complete curing of the plastic layers can be carried out either simultaneously for a plurality of plastic layers or successively. If curing is carried out successively, then, following the fitting of the semiconductor chips into the first plastic layer, a self-supporting, dimensionally stable body already results, and can be handled simply and reliably. It can even be stored temporarily until the application of the second plastic layer. The second plastic layer can then be applied by means of a transfer molding process or by means of a spin-casting process. While, for the transfer molding process, a filled epoxy resin is applied to the first plastic layer as the second plastic layer for leveling the surface of the blank, plastics based on polyimides are particularly suitable for the spin-casting process.

In order to cure the second plastic layer, the blank can be heated to 120 to 350° C. for 2 to 30 minutes. Even if a plurality of plastic layers are subjected to common curing, it is possible to operate with this temperature and time interval. Curing can be shortened substantially if the plastic layers of the blank are irradiated with UV light for a duration of a few seconds to a few minutes. The term "few" is used, in this context, in accordance with its common dictionary meaning.

Following the exposure of the contact regions of the semiconductor chips, wiring structure on the blanks can be applied to the cured, self-supporting and dimensionally stable plastic plate, which now constitutes the blank. The wiring structure has contact connecting surfaces which are deposited on the contact regions of the semiconductor chips. Furthermore, the wiring structure has wiring lines which lead to positions of external contacts. The formation of such a wiring structure can be carried out by means of chemical or electrochemical deposition of a metal.

Electrochemical deposition of the wiring structure on the upper side of the blank with exposed contact regions can advantageously be carried out in three stages. Firstly, a closed metal layer is applied by means of sputtering or an atomization technique. This metal layer, a few nanometers thick, is used to provide a large-area electrical contact for the electrochemical deposition on the self-supporting plastic plate of the blank. A photoresist mask is then applied in a pattern of the wiring structure, leaving the sputtered layer free, in such a way that regions which are not intended to have a wiring structure are covered by photoresist. A metal alloy is then deposited electrochemically in an electrolyte bath, forming the wiring structure. After the formation of the metallic wiring structure, the photoresist coating is removed. The sputtered layer is finally removed by etching the entire surface of the blank. During this etching operation, the thickness of the wiring structure is reduced only slightly. By means of the electrochemical application of the wiring structure, the wiring structure with its contact connecting surfaces is reliably connected to the contact regions of the semiconductor chips.

Given chemical deposition of a metallization as the wiring structure, it is possible to dispense with metallization of the entire surface of the blank and therefore, for example, with the sputtering step. One advantage of the chemical or electrochemical deposition of the wiring structure resides in the fact that wiring structures for a large number of electronic components can be deposited simultaneously on the blank.

An alternative method of applying the wiring structure is either to print the wiring structure on the blank by means of jet printing or to apply a wiring structure to the blank by means of a mask, as in the stencil printing process or screen printing process.

Further wiring layers can be applied to the plastic plate, by insulating layers with through-contacts and insulating layers with wiring lines being arranged alternately on the first wiring structure. The method according to the invention thus has the advantage that joining contact surfaces of a separate wiring plate to the contact regions of the semiconductor chip in every component position is dispensed with. It is neither necessary for a wiring plate to be provided, nor is it necessary to fit such a wiring plate with electronic components. Finally, pressing the plastic embedding compound in between wiring plate and semiconductor chip, endangering the electrical connections between the contact regions of the semiconductor chip and a wiring plate, is also dispensed with.

In summary, it should be recorded that the housing technology according to the invention does not achieve the necessary wiring from the contact regions of a semiconductor chip to the external contacts of an electronic component by means of a prefabricated intermediate carrier but, instead, wiring layers are applied layer by layer to a blank in a parallel process.

For this purpose, sawn semiconductor chips are pressed into a plastic embedding compound which has at least two different levels of crosslinking, the level of crosslinking in the region of the underside of the first plastic layer being higher than in the region of the first plastic layer located above.

The method according to the invention thus provides a reliable connection between contact connecting surfaces of a wiring structure and contact regions of a semiconductor chip for electronic components. In the method according to the invention, finally, external contacts can be applied to an external wiring layer of the blank in all component positions. With this step, it is ensured that the components of the blank can already pass through a functional test via the external contacts, so that defective components already on the blank can be marked.

In order to produce individual electronic components, such a blank is then merely separated at the boundaries of the component positions to form individual components.

An electronic component separated out from a blank of this type has the following features. The semiconductor chip is embedded in a multilayer plastic compound. In addition, the semiconductor chip is surrounded on its marginal sides by a first plastic layer, up to part of its marginal side height. This first plastic layer has a upper boundary to a second plastic layer located above. This second plastic layer rests on regions of the marginal sides of the semiconductor chip which are not already covered by the first plastic layer. Furthermore, the second plastic layer has an upper side which is now level and which forms an interface to at least one further component plane. Provided above the second plastic layer is at least one wiring structure with through-contacts between contact regions of the semiconductor chip and external contacts of the electronic component.

An electronic component of this type has the advantage that the wiring structure with the through-contacts to the contact regions of the semiconductor chip rests directly on the leveled surface of the second plastic layer. As a result, the contact between wiring structure and contact regions of the semiconductor chip can be made reliably, particularly since the contact regions of the semiconductor chips of the blank are completely exposed and accessible. In addition, the electronic component has the advantage that further wiring layers with interposed insulating layers can be applied to a wiring structure reliably connected in this way to the contact regions of the semiconductor chip, and thus complex wiring structures, which can have intersections and bridges, can be implemented in an extremely simple manner with an electronic component of this type.

According to the invention, a blank having a plurality of component positions for electronic components each having a semiconductor chip is provided, the blank having the following features.

The semiconductor chips embedded in the blank are surrounded on their marginal sides by a first plastic layer, in each case up to part of their marginal side height. This first plastic layer has a upper boundary to at least a second plastic layer located above. The second plastic layer rests on regions of the marginal sides of the semiconductor chips which are not already covered by the first plastic layer. Furthermore, the second plastic layer has a level upper side, which forms an interface to at least one wiring structure. Both above the second plastic layer and above the semiconductor chips, external contacts of electronic components are provided, which are connected via the wiring structure to the contact regions of the semiconductor chips. The first plastic layer and/or the second plastic layer are at least partly cured to form a self-supporting, substantially dimensionally stable, multilayer plastic plate.

A blank of this type has the advantage that the semiconductor chips are fixed in the component positions by the first plastic layer, and the second plastic layer forms a compensating layer for leveling the blank. Still further plastic layers can be arranged between the first and the second plastic layer. Furthermore, a blank of this type has the advantage that a plurality of electronic components is produced simultaneously with the blank.

In this case, both the electronic component and the blank have a first plastic layer which is based on a plastic embedding compound which has vertically staggered different levels of crosslinking. In this case, the highest level of crosslinking is arranged in the region of a base surface of the first plastic layer. This staggering of the level of crosslinking ensures defined positioning and fixing of the semiconductor chips in the first plastic layer and/or in the blank on each component position.

The first plastic layer can be based on a plastic embedding compound which has a completely crosslinked region in the region of a base plate and, above this, a precrosslinked region. In this case, the completely crosslinked region forms a mounting plate for the blank, on which the semiconductor chips are arranged at a defined height in the first plastic layer.

If such a completely crosslinked lower region is not present, then the first plastic layer can be filled with spherical particles, in particular of glass. These spherical particles form spacers for the semiconductor chips on account of their uniform, predefined diameter, and fix the semiconductor chips at a predefined height in the first plastic layer.

The second plastic layer can have a polyimide resin, which has the advantage that it can be structured by means of photolithography. Thus, the component or the blank can be covered uniformly and completely by the second plastic layer of polyimide resin. The contact regions of the semiconductor chip in the blank, if they are covered by the second plastic layer, can be exposed by a photolithographic step in the polyimide resin. The plastic plate can be provided with an adhesive layer, on which a wiring structure is anchored securely. An adhesive layer of this type can be applied over a large area, provided that the adhesive layer is composed of insulating oxides.

Depending on the construction of the electronic component, either the active upper side of the semiconductor chip with its contact regions or the passive rear side of the semiconductor chip can be arranged in the first plastic layer. In both cases, access to the contact regions is possible, the contact regions either projecting out of the upper side of the first plastic layer or, with their contact regions, penetrating the first plastic layer and being accessible from the underside of the first plastic layer. In both cases, the step of exposing the contact regions of the semiconductor chips can be carried out reliably and simply.

In summary, the result for the construction of a "wafer-level-package" or of a blank results in three possible variants for "fan-out" wiring, in which external contacts are not only arranged above the region of the semiconductor chip on the blank but are also present outside this region above the plastic plate of the blank, in the region of the plastic embedding compound. The three variants for "fan-out" wiring are explained in more detail in the appended figures.

With the first variant, the semiconductor chip is embedded with its passive rear side in a two-stage or "bi-stage" material. This variant has the following advantages:

The active upper side of the semiconductor chip does not have to be sealed off during the embedding process, and the contact regions of the semiconductor chip are kept reliably open.

For the construction of the expanded wafer, only a single fitting process is necessary. The process sequence is therefore simplified substantially and can be implemented cost-effectively.

For this concept, it is possible to dispense with elevated contact regions of the semiconductor chip, such as contact heads, contact pillars, contact balls or contact bumps.

In a second variant, the semiconductor chips fixed in a two-stage or "bi-stage" material of a first plastic layer are introduced into a subsequent transfer molding process in such a way that their passive rear side is embedded in the first plastic layer, and the rest of the marginal edges of the semiconductor chips are covered by plastic potting compound. In this case, the first plastic layer serves merely to fix the semiconductor chips, in order that the semiconductor chips can no longer be displaced during the transfer molding process. During the production of the carrier, for this variant a potted carrier without additional supporting material, such as a foil or a fixed carrier, can be used. In order to ensure the dimensional stability, the carrier can be heated and cooled deliberately in the lower regions, in order to achieve a high level of crosslinking. The upper region of the first plastic layer, in which the semiconductor chips are fixed, is then merely precrosslinked. This second variant has the following advantages:

No lost carrier is used. The carrier can be produced cost-effectively in a molding process.

The positioning and fixing of the semiconductor chips is simple.

For this concept, it is possible to dispense with elevated contact regions of the semiconductor chips.

A third variant places the semiconductor chips with their active upper sides in the two-stage or "bi-stage" material of the first plastic layer and, by using a transfer molding process, can leave the passive rear sides of the semiconductor chips free or protect them with a plastic potting compound. The third variant has the following advantages:

If complete embedding of all the semiconductor chip sides in the same material is carried out, optimum reliability of the production process and of the electronic components is achieved.

The active side of the semiconductor chip does not have to be sealed off in a complicated manner during embedding in the first plastic layer.

As a result of the complete embedding of the semiconductor chip, even above the active upper side of the semiconductor chip, the reliability of the construction is increased further, since the wiring layers can be applied to a standardized base surface. The further wiring and insulating layers thus do not have to be adapted with respect to the adhesion to the silicon of the semiconductor chips.

The elevated contacts do not have to constitute any solderable connections, since the semiconductor chips are not fixed by the contacts but by the plastic embedding compound of the first plastic layer.

If, during the transfer molding process, the rear side of the semiconductor chips is kept free of plastic potting compound, then an additional heat sink can be fitted there, in order to be able to dissipate a relatively high power loss during the operation of the electric components.

Other features which are considered as characteristic for the invention are set forth in the appended claims.

Although the invention is illustrated and described herein as embodied in a method of producing a universal semiconductor housing with precrosslinked plastic embedding compounds, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2 to 4 are schematic cross sections of intermediate products during the production of a blank according to a first exemplary method according to the invention, wherein:

FIG. 2 is a schematic cross section through a first plastic layer, which is arranged on a base plate;

FIG. 3 is a schematic cross section of a component position following the embedding of a semiconductor chip in the first plastic layer; and FIG. 4 is a schematic cross section through a blank following the application of a second plastic layer to the blank;

FIGS. 8 to 11 are schematic cross sections of intermediate products during the production of a blank according to a second exemplary method of the invention, wherein:

FIG. 8 is a schematic cross section through a first plastic layer on a base plate;

FIG. 9 is a schematic cross section through the first plastic layer following the embedding of semiconductor chips in the first plastic layer at component positions of the blank;

FIG. 10 shows a schematic cross section through a blank following the application of a second plastic layer; and FIG. 11 shows a schematic cross section through a blank following the application of a plurality of wiring layers on the component positions of the blank.

DESCRIPTION OF THE PREFERRED EMBODIMENTS

Figure 1:
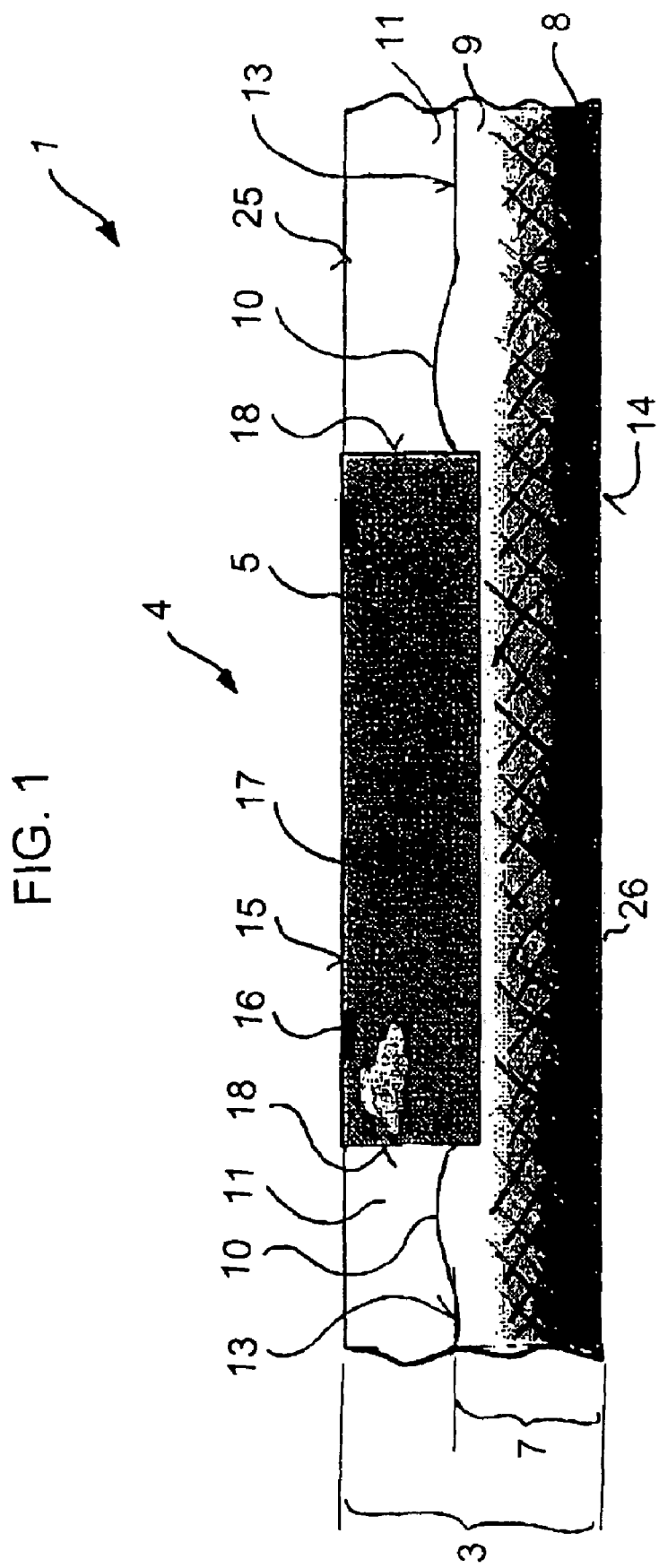
FIG. 1 is a schematic cross-section through a blank in the region of a component position.

Referring now to the figures of the drawing in detail and first, particularly, to FIG. 1 thereof, there is shown a schematic cross section through a blank 1 in the region of a component position 4. The blank 1 has a self-supporting, dimensionally stable plastic plate 3, in which a semiconductor chip 5 is embedded at the component position 4. The semiconductor chip 5 has an active upper side 15 with contact regions 16, and a passive rear side 17 and marginal sides 18. The semiconductor chip 5 is embedded with its passive rear side 17 in a first plastic layer 7 which, before the blank 1 is cured, has regions with a different level of crosslinking in a vertically staggered manner.

The plastic material used for the first plastic layer 7 is a so-called "bi-stage" material or two-stage material made of a thermosetting plastic. An upper region 9 of the first plastic layer 7 is crosslinked to a lesser degree before being cured than a lower region 8. The level of crosslinking, or degree of crosslinking, of the lower region 8 in this first embodiment is so high that there is already complete crosslinking before the plastic layers are cured. This highly crosslinked lower region 8 forms a stable base surface 26 which, at the same time, forms the base surface for the entire plastic plate 3 of the blank 1.

A bead 10 of plastic embedding compound of the first plastic layer 7 surrounds the semiconductor chip 5 in its marginal region at the sides 18. This bead 10 is formed as the semiconductor chip 5 is introduced with its passive rear side 17 into the upper region 9 of the first plastic layer 7. The bead 10 wets the marginal sides 18 in their lower regions and ensures that the semiconductor chip 5 is fixed in the first plastic layer 7 at one of the component positions 4 of the blank 1.

On account of the increasing degree of crosslinking of the first plastic layer 7 in the direction of the base surface 26, the semiconductor chip 5 is not forced with its passive rear side 17 to an arbitrary depth into the first plastic layer 7. The penetration depth of the semiconductor chip 5 in the first plastic layer 7 is defined by the level of crosslinking of the lower region 8 before being cured.

The contact regions 16 on the active upper side 15 of the semiconductor chip 5 remain completely free of the plastic embedding compound of the first plastic layer 7, since the semiconductor chip 5 projects with its active upper side 15 out of the first plastic layer 7. The regions of the marginal sides 18 of the semiconductor chip 5 which are not wetted by the first plastic layer 7 are covered by a second plastic layer 11, which forms a level upper boundary 25 without wetting the active upper side 15 of the semiconductor chip 5. This second plastic layer 11 forms a leveling compensating compound and adjoins an upper boundary 13 of the first plastic layer 7. This second plastic layer 11, in this embodiment of the invention, has a thermosetting plastic which is filled with insulating particles and which is applied by a transfer molding process. In the transfer molding process, the active upper side 15 of the semiconductor chip 5 was pressed onto a sealing film in an injection mold, so that the entire active upper side 15 of the semiconductor chip 5 is kept free of the material of the second plastic layer 11. On the flat upper boundary 25 of the second plastic layer 11 which is formed, a wiring structure, not shown here, is applied reliably to the blank 1, particularly since the contact regions 16 of the active upper side 15 of the semiconductor chip 5 are accessible for a wiring structure. A wiring structure of this type is applied layer by layer to the blank 1.

FIGS. 2 to 4 show schematic cross sections of intermediate products during the production of a blank according to a first exemplary embodiment of the novel method. Components with the same functions as in FIG. 1 are identified by the same designations in FIGS. 2 to 4 and not specifically explained.

FIG. 2 shows a schematic cross section through a first plastic layer 7 on a base plate 12. This first plastic layer 7 is carried by a base plate 12 made of a metal alloy and, in its lower region 8, has a level of precrosslinking which is higher than in its upper region 9. In addition, the first plastic layer 7 has a filling of glass spheres which have a uniform diameter. This diameter of the glass spheres is around a few hundred nanometers, the glass spheres being produced by means of a spraying process. The filling level of this first plastic layer with spherical particles is between 5 and 50% by weight. This low filling level means that, when the semiconductor chip 5, which is aligned above the first plastic layer 7 at the component position 4, penetrates in the direction of arrow A, a defined penetration depth for the semiconductor chip 5 is ensured. The spherical particles with uniform diameter in this case form spacers from the base plate 12 shown in FIG. 2. This ensures a spacing of only a few hundred nanometers between the underside 14 of the first plastic layer 7 and the passive rear side 17 of the semiconductor chip 5 as the semiconductor chip 5 penetrates in the direction of arrow A.

FIG. 3 shows a schematic cross section of a component position 4 after a semiconductor chip 5 has been embedded in the first plastic layer 7. In this case, the semiconductor chip 5 is introduced into the first plastic layer 7 until it is at a defined spacing from the base plate 12, a bead 10 of slightly crosslinked material of the upper region 9 of the first plastic layer 7 being formed. The upper boundary 13 of the first plastic layer 7 produced in the process is uneven and not suitable for the fitting of wiring structures. However, as the passive rear side 17 of the semiconductor chip 5 penetrates into the first plastic layer 7, the marginal sides 18 of the semiconductor chip 5 are wetted in a lower region, so that the semiconductor chip 5 remains fixed in these component positions 4. Displacement of the semiconductor chip 5 from the component positions 4 during subsequent method steps is prevented as a result.

FIG. 4 shows a schematic cross section through a blank 1 following the application of a second plastic layer 11 to the upper boundary 13 of the first plastic layer 7. In this first implementation example of the method, the second plastic layer 11 has a polyimide resin which completely covers the active upper side 15 of the semiconductor chip 5. In this embodiment of the invention, the polyimide resin is used simultaneously as a photoresist layer. With the aid of a photolithographic step, because of the photosensitive properties of the polyimide resin, contact regions 16 of the semiconductor chip 5 are exposed. In this first exemplary embodiment of the method, the polyimide resin forms a completely leveled upper boundary 25. For this purpose, a spinning process is used for the second plastic layer 11. Further method steps for a plurality of electronic components are then carried out simultaneously on the leveled interface 25.

Figure 5:
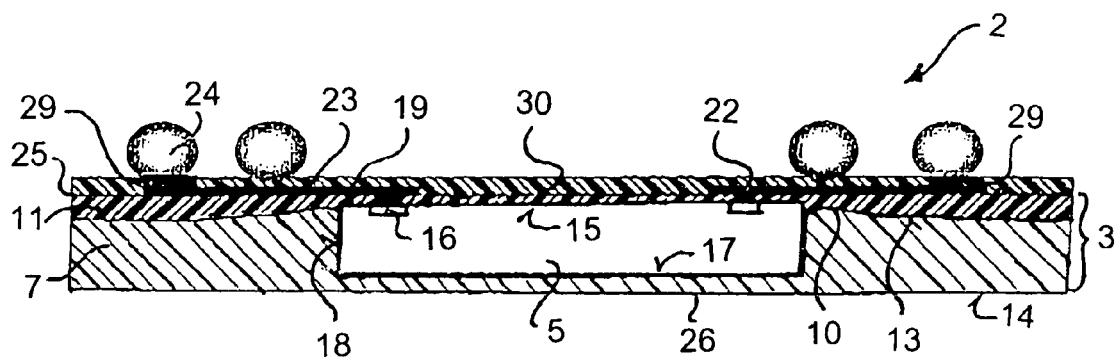
FIG. 5 is a schematic cross section of an electronic component of a first embodiment of the invention.

FIG. 5 shows a schematic cross section of an electronic component 2 of a first embodiment of the invention. Components with the same functions as in preceding figures are identified with the same designations and not explained specifically.

The blank from which this electronic component 2 of FIG. 5 has been separated is produced by a method which was explained above with reference to FIGS. 2 to 4. For this purpose, the metallic base plate 12 shown in FIG. 4 has been removed from the plastic plate of the blank before the blank is divided up into individual electronic components 2. In addition, in the second plastic layer 11, windows in which the contact regions 16 of the semiconductor chip 5 are freed of the second plastic layer 11 have been opened by a photolithographic step.

Arranged on the second plastic layer 11 is a wiring structure 19 which has through-contacts 22 to the contact regions 16 of the active upper side 15 of the semiconductor chip 5. The contact regions 16 are formed as surface contacts. The wiring structure 19, which has been applied to the plastic layer 11 in a chemical process, has wiring lines 23 which lead from the through-contacts 22 to external contact surfaces 29. These external contact surfaces 29 are arranged outside the region of the semiconductor chip 5 on the plastic plate 3 and bear external contacts 24 in the form of solder balls. Such an arrangement of the external contacts 24 is also designated a "fan-out". A solder stop resist layer 30, which surrounds the external contacts 25, protects the wiring lines 23 of the wiring structure 19 against wetting with joining material when the external contacts 24 are joined to the external contact surfaces 29.

Instead of the single-layer wiring structure 19, multilayer wiring structures are provided in an example of an electronic component 2 not shown here. For this purpose, wiring layers are applied successively, layer by layer, to the leveled second plastic layer 11.

Figure 6:
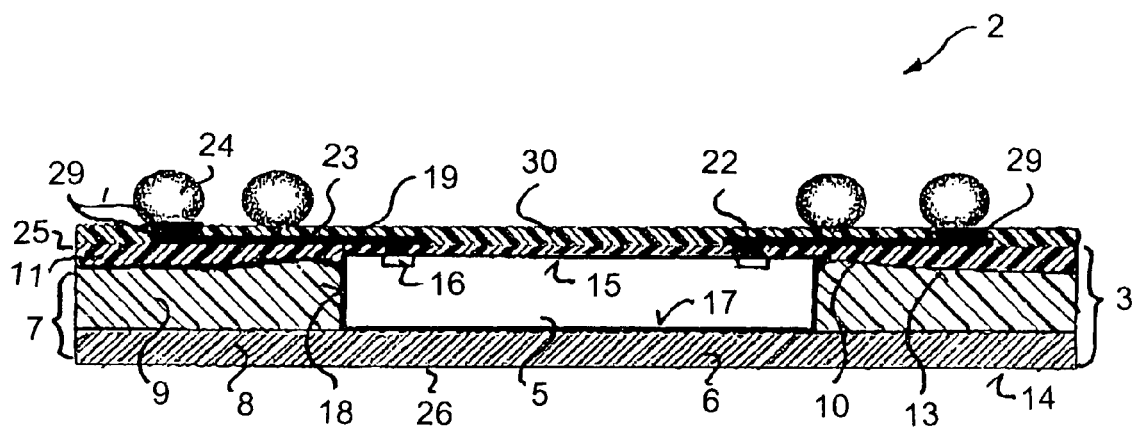
FIG. 6 is a schematic cross section of an electronic component of a second embodiment of the invention.

FIG. 6 shows a schematic cross section of an electronic component 2 of a second embodiment of the invention. Components with the same functions as in the preceding figures are identified with the same designations and not explained specifically.

The second embodiment of the invention differs from the first embodiment of the invention, shown in FIG. 5, in the fact that the lower region 8 of the first plastic layer 7 is completely crosslinked, so that a carrier plate of plastic is formed. A metallic base plate is not required to produce an electronic component 2 of this type, as opposed to the electronic component 2 of the first embodiment. The completely crosslinked lower region 8 forms a self-supporting, dimensionally stable base layer, on which the semiconductor chip 5 is aligned and arranged. The upper region 9 of the first plastic layer 7 is firstly only precrosslinked before the curing of the plastic layers 7 and 11, so that, as the semiconductor chip 5 penetrates into the first plastic layer 7, a bead 10 is formed around the marginal sides 18 of the semiconductor chip 5. The second plastic layer 11 is arranged as a compensating compound on the upper boundary 13 of the first plastic layer 7. This second plastic layer 11 forms a level upper boundary 25, on which a solder stop resist layer 30 is arranged. The arrangement and structure of the external contact surfaces and of the external contacts correspond to the first embodiment shown in FIG. 5.

Figure 7:
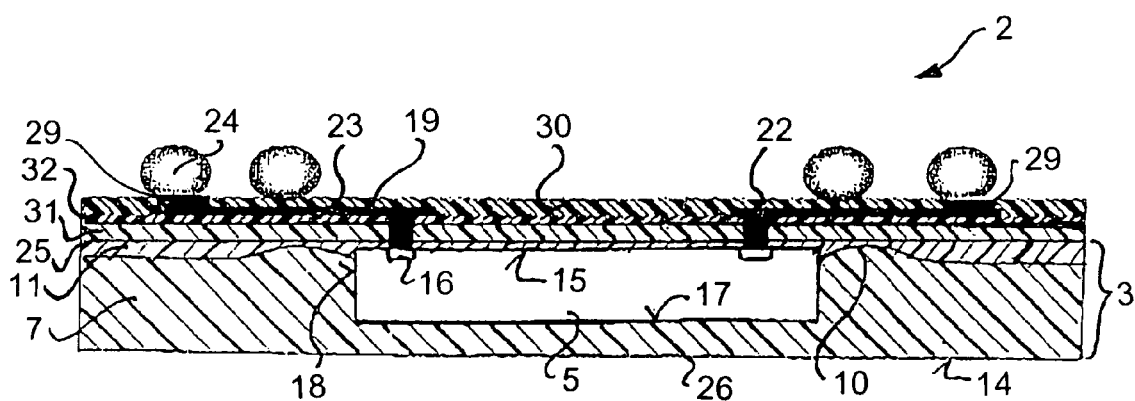
FIG. 7 is a schematic cross section of an electronic component of a third embodiment of the invention.

FIG. 7 shows a schematic cross section of an electronic component 2 of a third embodiment of the invention. Components with the same functions as in the preceding figures are identified by the same designations and not explained specifically.

The semiconductor chip 5 of the electronic component 2 of the third embodiment of the invention is also fixed with its passive rear side 17 in the first plastic layer 7. The third embodiment of the electronic component 2 differs from the first two embodiments, which are shown in FIGS. 5 and 6, in the fact that the contact regions 16 of the semiconductor chip 5 do not have any surface contacts. Instead, the wiring structure 19 is connected electrically to contact regions 16 of the semiconductor chip 5, which have elevated flip-chip contacts in the form of contact balls, contact bumps, contact pillars or contact heads. In order to compensate for the height of these flip-chip contacts, an insulating layer 39 is applied to the upper boundary 25 of the second plastic layer 11. A further insulating layer 32 with through-contacts 22 is arranged on the insulating layer 31. Arranged on this further insulating layer 32 is a wiring structure 19, which is connected electrically to the through-contacts 22. The arrangement and structure of the external contact surfaces 29 and of the external contacts 24 correspond to the embodiment shown in FIGS. 5 and 6.

While, in the three exemplary embodiments of the electronic component 2 and in the first method example relating to producing an electronic component 2 of this type, the semiconductor chip 5 is fixed with its passive rear side 17 in the first plastic layer 7 of a two-stage material or "bi-stage" material, FIGS. 8 to 11 will be used to explain a second implementation example of the method, in which semiconductor chips 5 are embedded with their active upper sides 15 in the first plastic layer.

FIGS. 8 to 11 show schematic cross sections of intermediate products during the production of a blank 1 according to a second method example of the invention. Components with the same functions as in the preceding figures are identified with the same designations in FIGS. 8 to 11 and not explained specifically.

The significant aspect which distinguishes the second implementation example of the method, shown by FIGS. 8 to 11, from the first implementation example, shown by FIGS. 2 to 4, consists in the fact that, in the second implementation example, the semiconductor chips 5 are introduced into the first plastic layer 7 of a two-stage material at the component positions 4 with their active upper sides 15 in this material.

FIG. 8 shows a schematic cross section through a first plastic layer 7 on a base plate 12. The first plastic layer 7 has a lower region 8 which is more highly crosslinked than an upper region 9. The dashed line 33 identifies the transition from the more highly crosslinked lower region 8 to the less highly crosslinked upper region 9. A vertical dash-dotted line 34 in FIG. 8 identifies the boundary between two component positions 4, over which in each case a semiconductor chip 5 is aligned in such a way that it can be introduced with its active upper side 15 and the contact regions 16 into the first plastic layer 7 in the direction of arrow A.

On account of its precrosslinked state, the plastic layer 7 is solid at room temperature and reaches a partly viscous state in the more highly cross-linked lower region 8 and a state of lower viscosity in the upper region 9 when the first plastic layer 7 is heated to temperatures between 90 and 120° C. Following the heating of the first plastic layer 7 to such a temperature, the semiconductor chips 5 are introduced with their active upper sides 15 into the first plastic layer 7 in the direction of arrow A.

FIG. 9 shows a schematic cross section through the first plastic layer 7 after the semiconductor chips 5 have been embedded in the first plastic layer 7 at the component positions 4 of the blank. In this case, a bead 10 forms in the upper region 9 of the first plastic layer 7, surrounds each semiconductor chip 5 in its marginal regions 18 and thus fixes the semiconductor chip 5 in the component positions 4 of the blank. When the semiconductor chips 5 are introduced into the first plastic layer 7, the contact regions 16 of the semiconductor chips 5 touch the base plate 12. By means of further heating of the first plastic layer 7 to temperatures between 120° C. and 350° C. for 2 minutes to 30 minutes, the first plastic layer 7 is crosslinked completely and forms a upper boundary 13.

Figure 10:
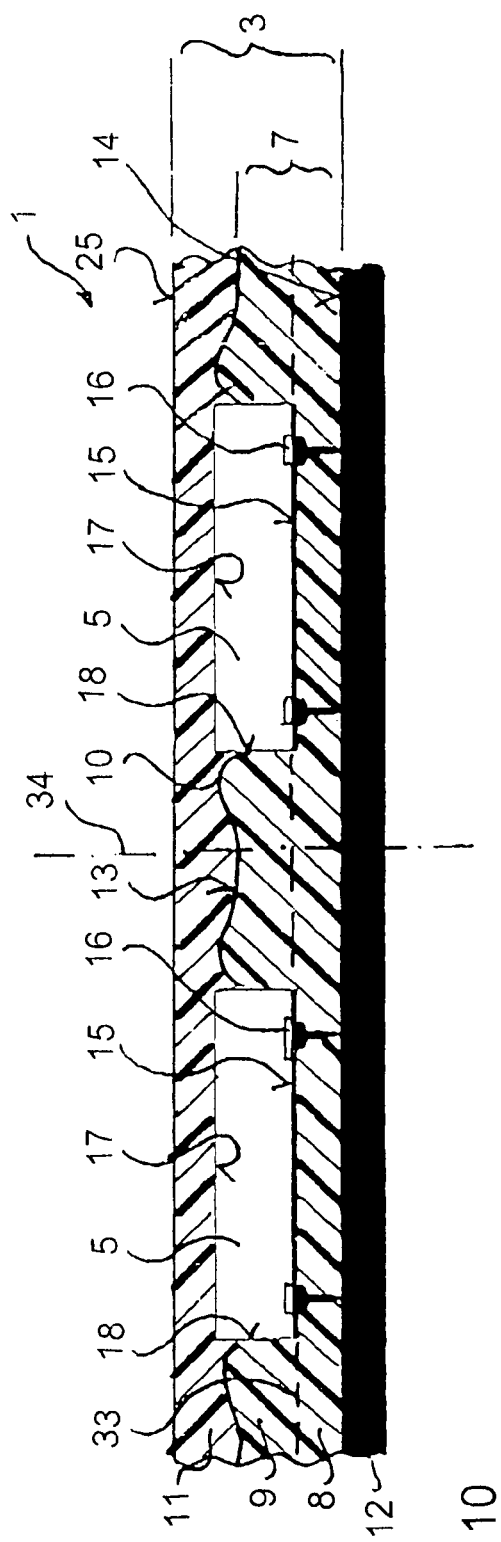

FIG. 10 shows a cross section through a blank 1 following the application of a second plastic layer 11. As opposed to the first implementation example of the method, which was explained using FIGS. 2 to 4, the second plastic layer 11 does not cover the active upper sides 15 of the semiconductor chips 5 but the passive rear sides 17 of the semiconductor chips 5. The passive rear sides 17 are therefore protected against mechanical damage.

In a further implementation example of the method, not shown here, the second plastic layer 11 is applied while leaving the passive rear sides 17 of the semiconductor chips 5 free. In this case, there is the possibility of fitting heat sinks directly to the passive rear sides 17 of the semiconductor chips 5, in order to dissipate heat losses during operation following the completion of the electronic components.

Figure 11:
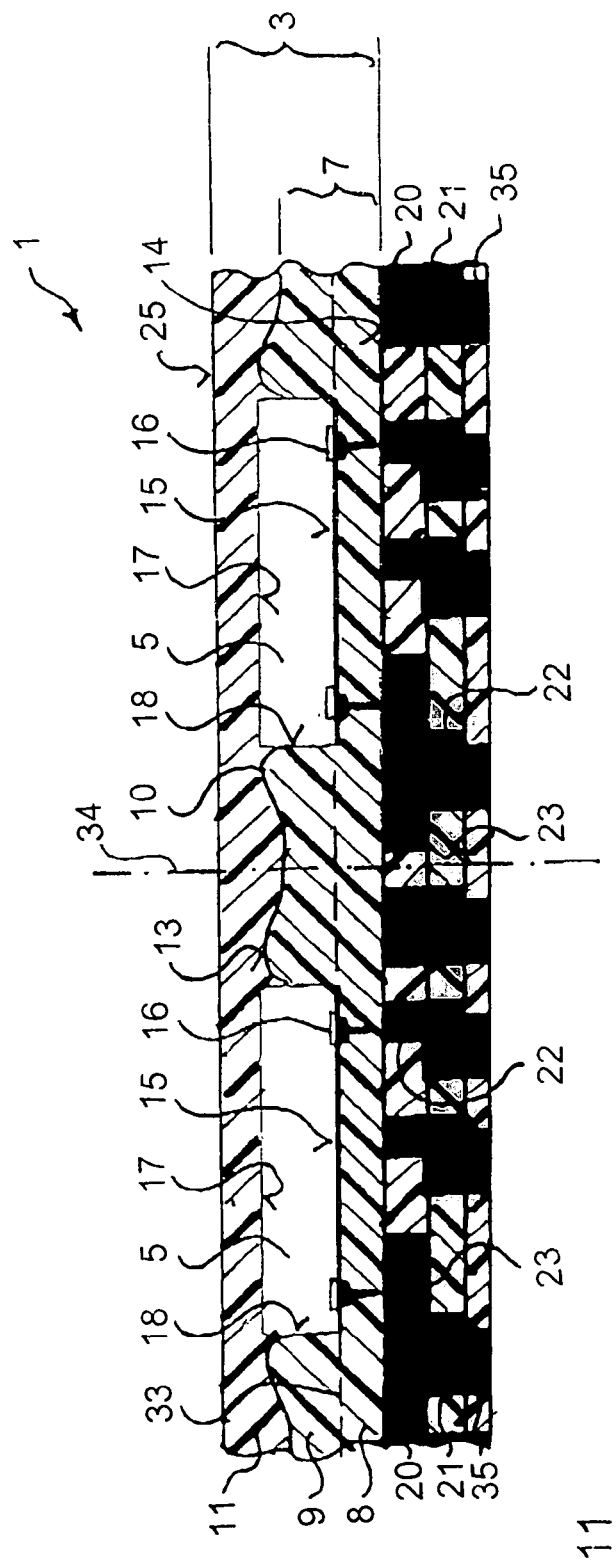

FIG. 11 shows a schematic cross section through a blank 1 following the application of a plurality of wiring layers 20, 21 and 35 to the blank 1 in the component positions 4. Before such an application of a plurality of wiring layers 20, 21 and 35, the metallic base plate 12 shown in FIG. 10 is removed from the blank 1. This removal of the metallic base plate is carried out by means of an etching technique. Given appropriate surface preparation of the base plate, the latter is also pulled off the plastic plate 3 of the blank 1, exposing the contact regions 16 of the semiconductor chips 5. For this purpose, the surface of the base plate 12 shown in FIG. 10 has a thin coating of a few 100 nanometers, for example of polytetrafluoroethylene.

As FIG. 11 shows, with the method according to the invention, complex wiring structures comprising a plurality of wiring layers 20, 21 and 35 can be implemented simultaneously on the plastic plate 3 of the blank 1 for a plurality of electronic components. Following the completion of the wiring layers 20, 21 and 35, external contacts not shown here are applied to the external wiring layer 35. The blank 1 is then divided along the dash-dotted line 34 into individual electronic components.

We claim:

1. A method of producing a blank having a plurality of component positions for electronic components, the method which comprises the following method steps:

producing at least one of a carrier plate and a first plastic layer from a plastic compound being more highly crosslinked in a lower region than in an upper region;

fitting a semiconductor chip in each of the component positions of the blank, and thereby forming a bead of plastic compound of the first plastic layer, the bead surrounding marginal sides of the semiconductor chip;

applying a second plastic layer; and curing the plastic layers for forming a self-supporting, dimensionally stable plastic plate with embedded semiconductor chips in the component positions.

2. The method according to claim 1, wherein the step of producing the carrier plate comprises coating a base plate heated to a temperature between 120 and 350° C. with the first plastic layer of a plastic compound that, when the carrier plate with the first plastic layer is cooled down, defines a degree of crosslinking decreasing toward an upper boundary layer of the first plastic layer.

3. The method according to claim 1, wherein the carrier plate is produced from a solid plastic, and the step of producing the carrier plate comprises subjecting the first plastic layer of uncrosslinked plastic embedding compound to a temperature gradient, to partly crosslink the plastic embedding compound with a degree of crosslinking of the compound decreasing toward an upper boundary of the first plastic layer, and to form a first, substantially completely crosslinked, self-supporting, dimensionally stable lower region toward an underside in the first plastic layer.

4. The method according to claim 1, which comprises providing an uncrosslinked plastic embedding compound for producing the first plastic layer filled with spherical particles of uniform sphere diameter.

5. The method according to claim 4, wherein the spherical particles are glass spheres.

6. The method according to claim 1, wherein the fitting step comprises initially pressing the semiconductor chip with an active upper side and the contact regions arranged thereon into the first plastic layer, forming the bead of plastic compound of the first plastic layer, the bead surrounding the marginal sides of the semiconductor chip, until the contact regions contact a metal carrier plate, and subsequently covering the passive rear side of the semiconductor chip with the second plastic layer.

7. The method according to claim 1, wherein the fitting step comprises initially pressing the semiconductor chip with a passive side thereof into the first plastic layer, forming the bead of plastic compound of the first plastic layer, the bead surrounding the marginal sides of the semiconductor chip, and subsequently leveling the blank with the second plastic layer and leaving free at least contact regions of the semiconductor chip.

8. The method according to claim 7, which comprises leaving free an entire active upper side of the semiconductor chip.

9. The method according to claim 1, which comprises, following the step of applying the second plastic layer, completely crosslinking the plastic compounds of the plastic layers by heating.

10. The method according to claim 1, which comprises, following the step of fitting the semiconductor chip into the first plastic layer in the component position of the blank, completely crosslinking the first plastic layer by heating.

11. The method according to claim 1, which comprises applying the second plastic layer to a completely crosslinked first plastic layer with a transfer molding process.

12. The method according to claim 1, which comprises applying the second plastic layer to a completely crosslinked first plastic layer with a spin-casting process.

13. The method according to claim 1, which comprises curing the second plastic layer by heating the blank to a temperature of between 120 and 350° C. for 2 to 30 minutes.

14. The method according to claim 1, which comprises curing the second plastic layer by irradiating the blank with UV light.

15. The method according to claim 14, which comprises irradiating for a duration ranging from a few seconds to a few minutes.

16. The method according to claim 1, wherein the semiconductor chip is formed with contact regions, and the method comprises placing a wiring structure, for electrically connecting to the contact regions in the semiconductor chip, to the self-supporting, dimensionally stable plastic plate in each component position.

17. The method according to claim 1, which comprises exposing contact regions of the semiconductor chips of a blank with a photolithographic step.

18. The method according to claim 16, wherein the step of placing the wiring structure comprises chemically or electrochemically depositing a metal.

19. The method according to claim 16, wherein the step of placing the wiring structure comprises a three-stage electrochemical deposition process, including, first depositing a closed metal layer by sputtering, subsequently applying a photoresist mask in a pattern of the wiring structure, leaving the sputtered layer free, and, finally, electrochemically depositing metal on the structure having been left free, forming the wiring structure, and removing the photoresist layer and the sputtered layer following the formation of the wiring structure.

20. The method according to claim 16, wherein the step of placing the wiring structure comprises printing the wiring structure on the plastic plate in each component position.

21. The method according to claim 16, which comprises forming further wiring layers on the plastic plate, by alternately arranging insulating layers with through-contacts and insulating layers with wiring lines on the at least one wiring structure.

22. The method according to claim 1, which comprises fitting external contacts to an external wiring layer of the blank.

23. A method of producing an electronic component, which comprises:
   producing a blank in accordance with the method of claim 1; and
   separating portions of the blank at component positions to form individual electronic components.

* * * * *